United States Patent [19]

Leeb et al.

[11] Patent Number: 5,292,054
[45] Date of Patent: Mar. 8, 1994

[54] METHOD OF MANUFACTURING HEAT TRANSFER DEVICES, AND A TOOL FOR CARRYING OUT THE METHOD

[75] Inventors: Karl-Erik Leeb, Djurshamn; Ulf I. Holmberg, Järfälla, both of Sweden

[73] Assignee: Telefonaktiebolaget L M Ericsson, Stockholm, Sweden

[21] Appl. No.: 811,583

[22] Filed: Dec. 20, 1991

[30] Foreign Application Priority Data

Dec. 20, 1990 [SE] Sweden .................. 9004081

[51] Int. Cl.⁵ ............................... B23K 31/02
[52] U.S. Cl. .................. 228/179.1; 228/183; 228/180.21; 29/743
[58] Field of Search .............. 228/183, 212, 256; 29/464, 468, 743; 357/81; 294/64.1

[56] References Cited

U.S. PATENT DOCUMENTS

| | | | |
|---|---|---|---|
| 3,399,444 | 9/1968 | Jacoby | 228/183 X |
| 3,699,641 | 10/1972 | Kuhnen | 228/212 |
| 4,135,630 | 1/1979 | Snyder et al. | 29/740 X |
| 4,389,064 | 6/1983 | Laverriere | 294/64.1 |
| 4,546,405 | 10/1985 | Hultmark et al. | 361/386 |
| 4,624,405 | 11/1986 | Newell | 228/212 |
| 4,953,287 | 9/1990 | West | 29/743 X |
| 5,088,639 | 2/1992 | Gondotra | 228/180.2 X |
| 5,113,315 | 5/1992 | Capp | 357/81 X |

FOREIGN PATENT DOCUMENTS

| | | |
|---|---|---|
| 2510679 | 9/1976 | Fed. Rep. of Germany . |
| 2944810 | 5/1980 | Fed. Rep. of Germany . |
| 435228 | 9/1984 | Sweden . |

*Primary Examiner*—Paula A. Bradley
*Assistant Examiner*—Chuck Y. Mah
*Attorney, Agent, or Firm*—Burns, Doane, Swecker & Mathis

[57] ABSTRACT

The present invention relates to a method of manufacturing a heat transfer device, particularly a heat transfer device for cooling electronic components, having a metal plate and a plurality of cylindrical metal pins which are packed relatively densely on the plate and extend perpendicularly therefrom. The inventive method comprises the steps of cleaning the plate (1) and the pins (2) and treating the same with fluxing agent; loading the pins (2) into a pin holding device (4, 7) and affixing the pins by means of said device in mutually radial positions and holding the pins at an axial distance above the plate (1). Solder material (13) is applied to the plate (1) and caused to melt. The pins (2) are then lowered simultaneously down into the molten solder (13) and the solder is caused to solidify while maintaining the pins (2) in their fixed radial positions, whereafter the holder device (4, 7) is removed. The invention also relates to a tool in the form of a holding device intended for use in the manufacture of a heat transfer device and for carrying out the method.

8 Claims, 3 Drawing Sheets

METHOD OF MANUFACTURING HEAT TRANSFER DEVICES, AND A TOOL FOR CARRYING OUT THE METHOD

TECHNICAL FIELD

The present invention relates to a method of manufacturing a heat transfer device which is intended, in particular, for cooling electronic components and which comprises a metal plate having mounted thereon a plurality of cylindrical metal pins which extend perpendicularly to the plate and which are arranged in a mutually dense relationship. The invention also relates to a tool in the form of a holder device for use when carrying out the method of manufacturing said heat transfer device.

BACKGROUND ART

Many electronic components become hot due to the power losses that occur during the electric function of said components. This is the case, for instance, with terminal stage transistors for radio transmitters. The useful life of the components decreases rapidly at elevated temperatures. It is therefore essential to conduct heat away from the components in an effective manner, particularly in the case of the electronic components in equipment where a long useful life is desired, such as telecommunication equipment, for instance. A normal manner of effecting such heat transport is to conduct the heat away from the active element, for instance a transistor chip, through a transfer element which is joined to a device in which heat is transferred to air passing therethrough. Both the efficiency of the thermal conduction from the active element to the heat transfer element and the transfer of heat to the cooling air has direct significance on the temperature difference between the active element and the cooling air.

The following parameters are significant when optimizing air-cooled heat transfer devices: The pronounced or large temperature difference shall prevail between the heat transfer surfaces of said device and the cooling air; the cooling air shall move at a high speed; the heat transfer surfaces shall be large; and the boundary layer shall have a small thickness. By boundary layer is meant here the air layer which lies nearest the heat transfer surface where a gradient of temperature and air velocity prevails.

Those heat transfer devices normally used for cooling electronic components are often of the flanged type which are manufactured by casting, injection moulding, rolling or milling processes. Other known heat transfer devices have the form of corrugated metal sheet. One particular heat transfer device has the form of a cast or moulded device comprising cylindrical pins which extend perpendicularly to a main surface of a pin-carrying plate.

Cylindrical pins which are flushed with cooling air have been found to provide highly effective heat transfer devices, due to a combination of favourable material areas perpendicular to the heat flow in the axial direction of the pins and thin boundary layers alternating with turbulence. One problem is that this design principle often cannot be optimized when practicing the aforesaid manufacturing methods. The combination of pins having a diameter and a pitch which is optimal from a thermal aspect is impossible to manufacture by casting or moulding techniques. In addition to the purely physical requirements, there is often a requirement for low manufacturing costs. Milling constitutes a problem in this regard, because manufacture of the device will then take a relatively long time to complete.

The optimal configuration in this regard, is dependent on the size of the active element and on the pressure and flow rate of the air source used. In one example, where two transistors develop 125 W heat in total, there was used a fan which generated 0.8 m$^3$/min. and 200 Pa, wherewith an effective heat transfer was obtained with pins having a diameter of 3 mm, a length of 24 mm, and a pitch or centre-to-centre arrangement of 5 mm. The pins were mounted perpendicularly to one main surface of a plate having a thickness of 4 mm with said surface measuring 83×33 mm and thus accommodating 119 cylinders. This configuration cannot be cast, injection moulded, rolled, milled or forged.

The material from which the heat transfer device is made shall have the highest possible thermal conductivity, since this will enable the device to be given smaller dimensions than would otherwise be possible, which in turn results in shorter conduction paths and smaller temperature differences. The cast aluminium alloys usually used have about 150 W/m° C., pure aluminium about 200 W/m° C., and copper and silver about 400 W/m° C. Pure copper can therefore be used advantageously for the manufacture of compact heat transfer devices, but is still more discriminating in the choice of manufacturing methods.

When soldering cylindrical copper pins to a copper plate, the distribution of the solder, among other things, creates a problem. Due to the high thermal conductivity of copper, a pin cannot be soldered to the copper plate without melting adjacent pins. This means that the solder joint alone cannot be used as a fixation means when soldering one pin at a time. If several pins are to be soldered in position simultaneously and these pins are held in position on the copper plate by means of a jig or like fixture, the solder will first melt and wet a given part of said surface. This area of the plate and the pins first wetted by the solder will then suck solder from the surroundings and the solder will rise up between the relatively densely packed pins as a result of capillary action. This means that the solder layers will have greatly varying thicknesses, which presents a problem.

DISCLOSURE OF THE INVENTION

The object of the present invention is to avoid the problems associated with present methods of manufacturing heat transfer devices of the kind described, and to provide a method which is both simple and reliable, and also to provide a purposeful and practical tool by means of which the method can be carried out. The invention is based on the concept of mass soldering cylindrical pins on a flat plate with the aid of a special tool. This inventive concept is realized by a method and a tool having the characteristic features set forth in the characterizing clauses of respective method and apparatus Claims.

One advantage of the inventive method is that heat transfer devices having optimum thermal configurations can be manufactured quickly and inexpensively, with densely packed cylindrical pins for optimum heat transfer properties. The inventive tool is constructed to enable the method to be carried out quickly and reliably.

Further objects of the present invention and further advantages afforded thereby will be evident from the

BEST MODE OF CARRYING OUT THE INVENTION

Figure 1:
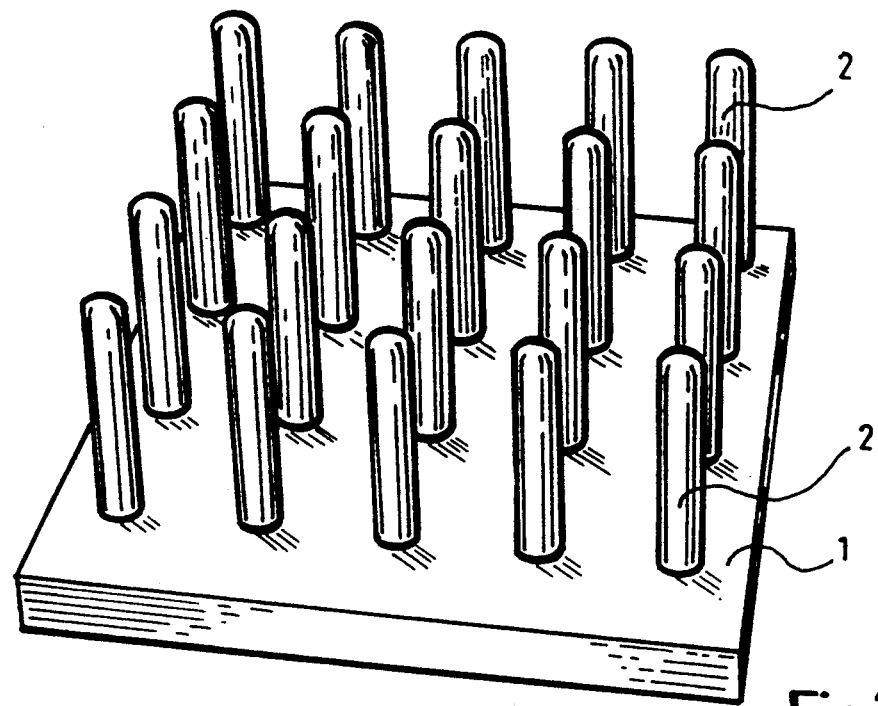
FIG. 1 illustrates in perspective a heat transfer device manufactured in accordance with the inventive method.
Figure 2:
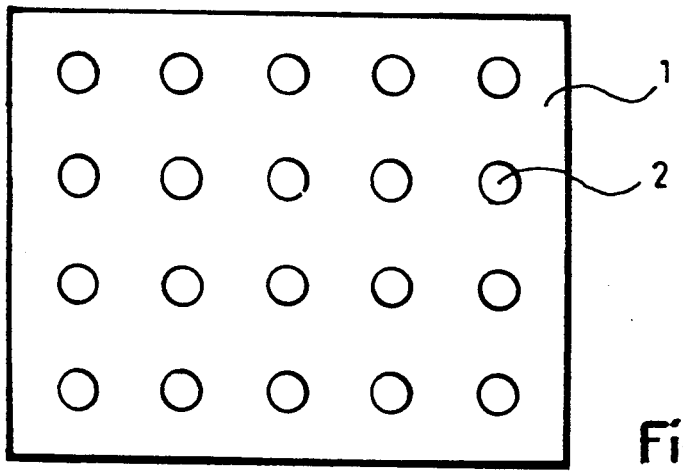
FIGS. 2 and 3 illustrate from above two different embodiments of the heat transfer device shown in FIG. 1.
Figure 3:
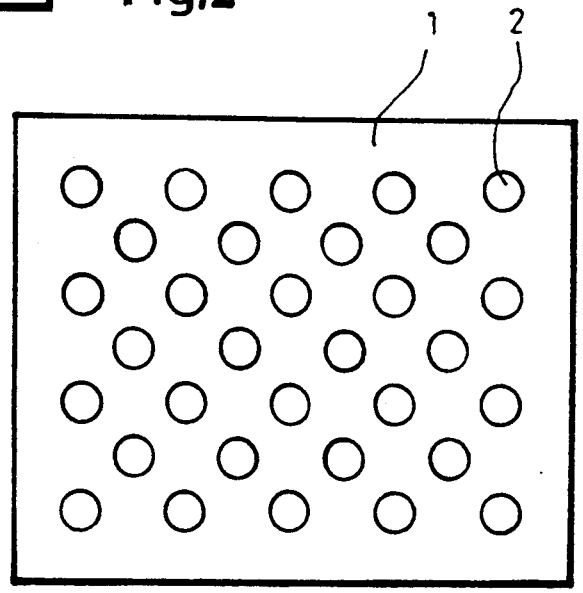

FIG. 1 illustrates a typical heat transfer device capable of being manufactured in accordance with the inventive method. The device includes a metal plate 1 on which a plurality of cylindrical pins 2 are soldered. The plate and the pins are preferably made of copper. The pins 2 are densely packed together and consequently the device cannot be manufactured by conventional methods. FIGS. 2 and 3 illustrate the device from above and show two respective examples of the positioning of the pins on the plate. The Figures are only intended to illustrate a general design of the device. In reality, the pins can be placed much more closely together than is illustrated, preferably in accordance with the example described above.

Figure 4A:
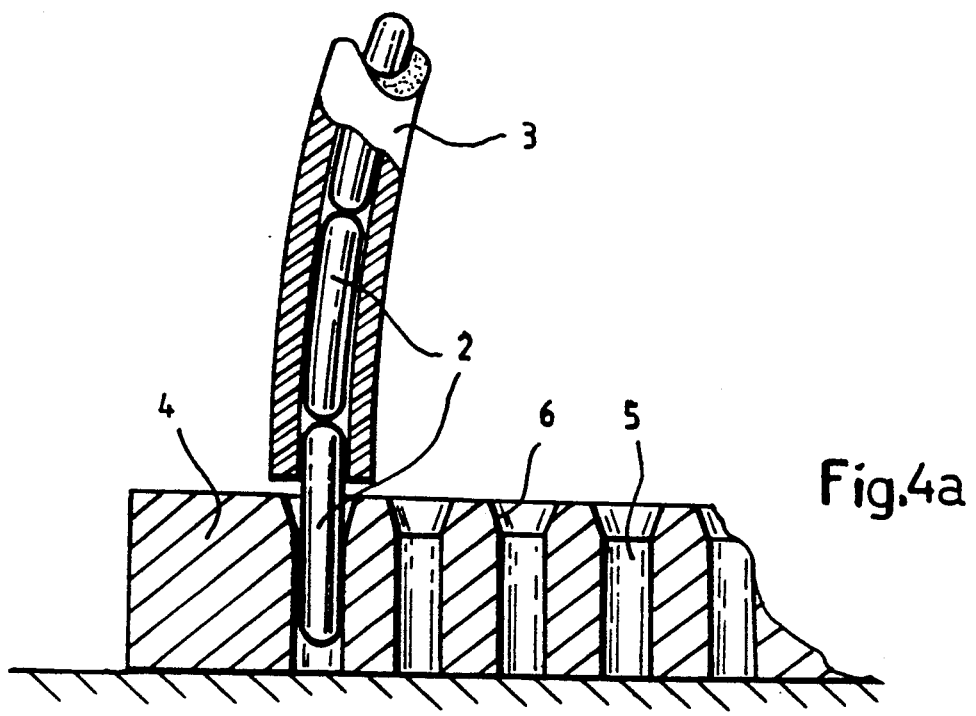
FIGS. 4a–4c illustrate different stages of one step of manufacture, and also shows part of a tool by means of which the inventive method can be carried out.

The cylindrical pins 2 are preferably manufactured automatically, by passing a drawn copper rod through a truing device and a high speed grinder. The edges left on the pins are rounded in a tumbler. The thus manufactured cylindrical pins 2 are advanced on a vibrator to a plastic hose 3 whose inner diameter is slightly larger than the diameter of the pins. The pins are positioned sequentially in the axial direction of the hose, as illustrated in FIG. 4a. The line of pins 2 in said hose are able to move gravitationally therealong when the tube extends generally vertical. The lower end of the hose is held positioned over a displaceable perforated plate 4, which forms a part of a holder device or tool according to the invention. The plate 4 is perforated with penetrating holes 5, which are formed in a pattern corresponding to the desired position of the pins 2 in the finished heat transfer device.

Figure 4B:
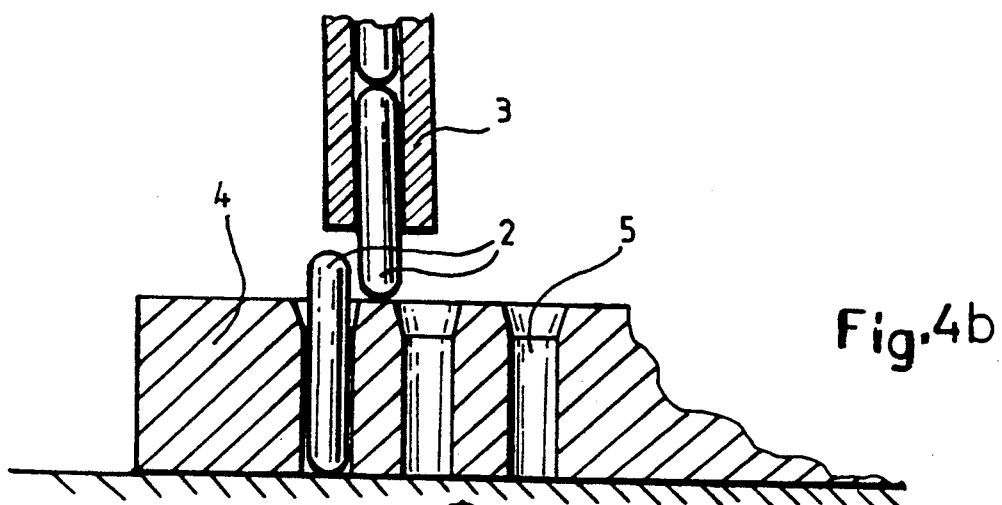
Figure 4C:
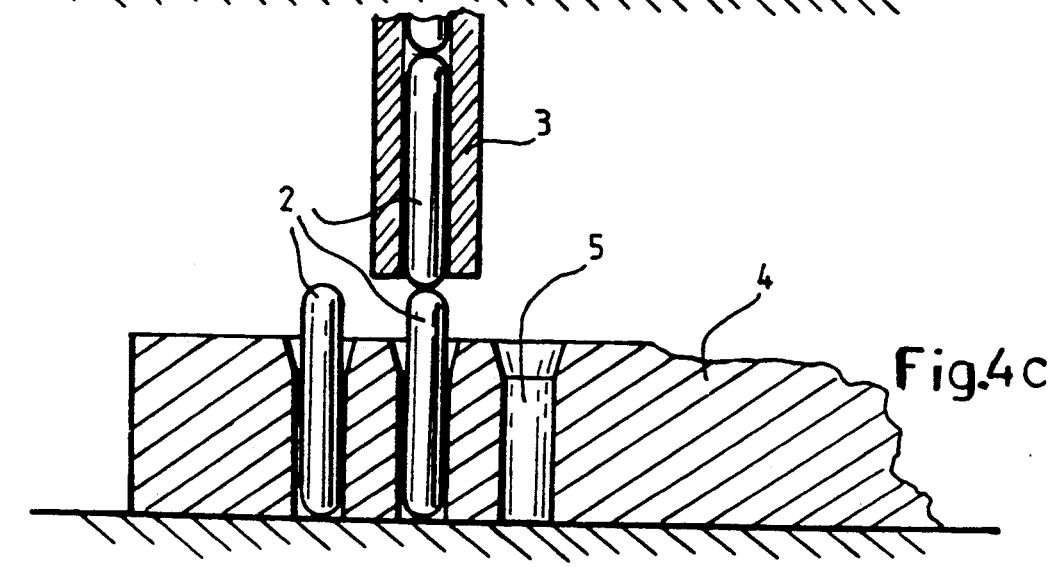

The upper edge of respective holes 5 is provided with an entry cone 6. In this stage of manufacture, the perforated plate 4 is placed on a table which can be moved in two dimensions of the table plane. The plate is moved by means of linear devices which are driven by stepping motors and controlled by a computerized control system. When the plate 4 is brought to a position in which a hole 5 is located immediately beneath the hose 3, a pin 2 will fall down from the hose and into the hole. The line of pins 2 in the hose 3 will then follow in succession. When the table, and therewith the plate 4, is displaced laterally, the pin 2 which is next in turn will first slide from away the pin which has newly fallen into the hole and then slide onto that surface of the plate which is located before the next hole 5, as shown in FIG. 4b. Continued movement of the table will bring the hose 3 to a position in which it is located immediately above the next hole 5, wherein said pin 2 will also drop down into this hole, as illustrated in FIG. 4c. This procedure is repeated until all of the holes 5 of the perforated plate 4 are filled with pins 2. This procedure can be carried out automatically at many times the speed that can be achieved when fitting the pins manually.

Figure 5:
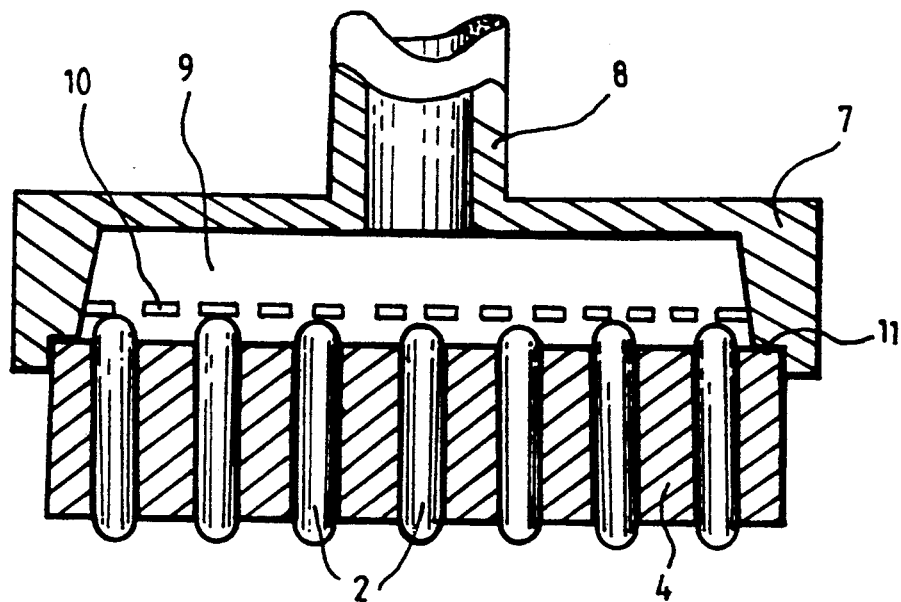
FIG. 5 illustrates the complete tool.

The next stage, shown in FIG. 5, involves lifting the perforated plate 4 and the pins 2 inserted therein with the aid of a vacuum suction device 7, which forms another part of the holder device or tool. The suction device 7 is provided with a connection 8 for connection to a vacuum source (not shown), a distribution chamber 9 and a screen plate 10 which prevents the pins 2 from being sucked into the chamber and which fixes the pins axially. The suction device 7 has a flat surface 11 which seals against the plate 4. The vacuum source shall have a capacity which is so great as to ensure that a vacuum will be sustained despite air leaking between the pins 2 and the holes 5. This will enable the plate 4 and all of the pins 2 to be lifted simultaneously.

Figure 6:
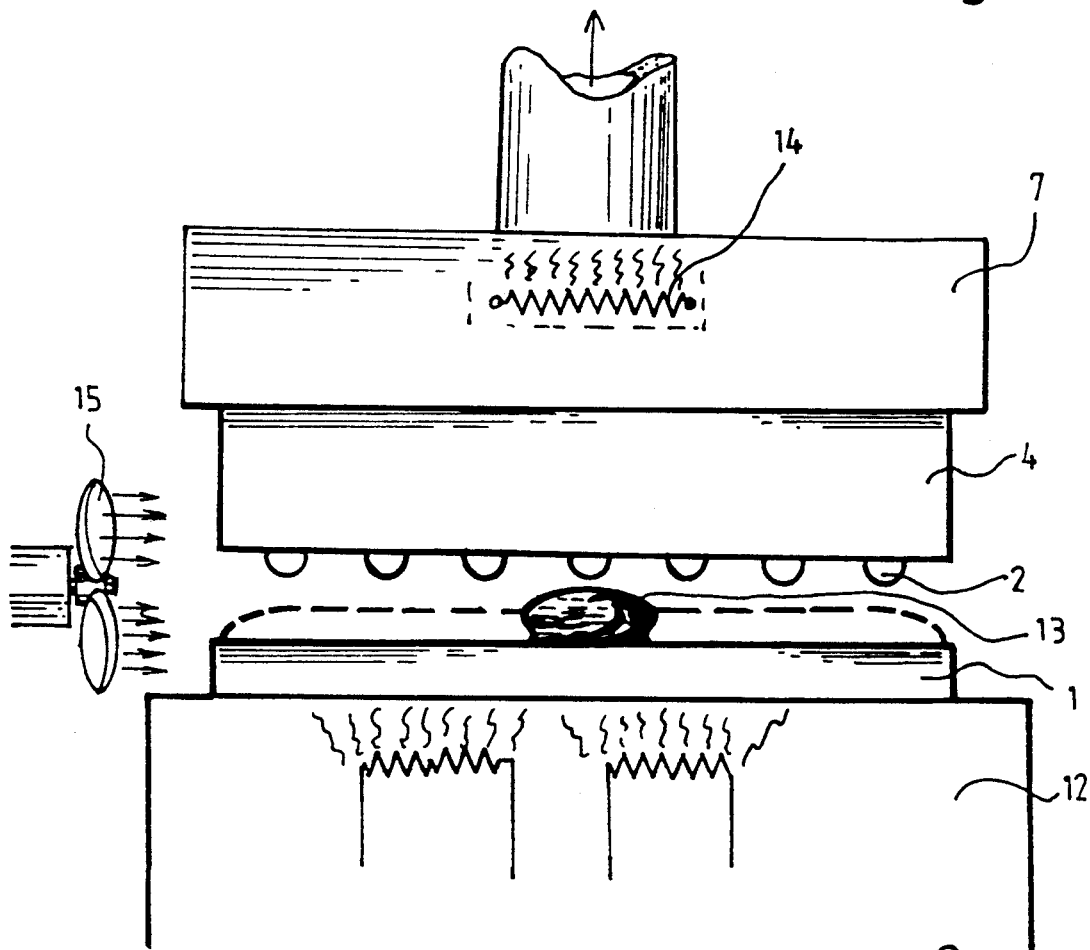
FIG. 6 illustrates a further step in the method of manufacture.

FIG. 6 illustrates the next stage of manufacture, in which a metal plate onto which the cylindrical pins 2 are to be soldered, is placed and affixed to a thermostat-controlled heating table or electric hot plate 12. The pins 2 are initially in an upper position in the perforated plate 4 and are held in this position by the suction force generated in the suction device 7. The holding device or tool 4, 7 is fixed in relation to the plate 1 such that the pins 2 will be spaced slightly from the plate. An appropriate amount of solder alloy 13 is placed on the plate 1 and melted, by heating the hot plate 12 to a temperature at which the solder 13 will melt and flow out on the plate 1. Naturally, the pins 2 and the plate 1 have previously been cleaned and treated with a soldering flux. When the solder 13 has melted and flowed out on the plate, as indicated by a broken line in FIG. 6, and the plate 1 has reached the correct temperature, which depends on the type of solder used, the vacuum in the suction device 7 is terminated, therewith causing all of the pins 2 to fall simultaneously down into the molten solder 13.

When solder having a high melting point is used, it may be advantageous also to control heating of the plate 4 by means of a thermostat. To this end, the holder device may be provided with a schematically illustrated heating device 14. When the solder 13 has wetted the pins 2, the heat transfer device is cooled by blowing cold air over the soldering position from one side, with the aid of a schematically illustrated cooling fan 15. The perforated plate 4 can then be separated from the firmly soldered pins and the tool removed and used for the manufacture of the next device.

It will be understood that the invention is not restricted to the aforedescribed and illustrated embodiment thereof, and that modifications can be made within the scope of the following Claims.

We claim:

1. A method of manufacturing a heat transfer device comprising a metal plate and a plurality of cylindrical metal pins fixedly mounted on said plate perpendicularly thereto in relatively densely packed relationship, comprising the steps of:

cleaning the plate and the pins and treating the same with fluxing agent;

loading the pins into a pin holding device and affixing the pins by means of said device in mutually radial positions and holding the pins at an axial distance above the plate;

applying solder material to the plate and melting said solder material;

causing the pins to be lowered simultaneously down into the molten solder material;

causing the solder material to solidify while maintaining the pins in said fixed radio positions; and removing the holder device.

2. A method according to claim 1, wherein cold air is blown over the soldering location so as to solidify said solder material.

3. A method according to claim 1, wherein the solder material is melted by heating the plate on a thermostat-controlled hot plate.

4. A method according to claim 1, comprising the further step of heating the pins with the aid of a thermostat-control device prior to lowering the pins into the molten solder material.

5. A method according to claim 1 wherein both the metal plate and the metal pins are made of copper.

6. A holding device for use in a manufacture of heat transfer devices, comprising:

a perforated plate having provided therein a plurality of penetrating holes disposed in a pattern which corresponds to the positions of respective pins in the finished heat transfer device, the diameter of said holes being slightly larger than the diameter of the pins;

a suction device which is adapted to the perforated plate and which includes a distribution chamber capable of being connected to a vacuum source, such that when a subpressure is generated in the chamber, the perforated plate and pins loaded into the holes will be lifted; and a thermostat-controlled heating device.

7. An apparatus according to claim 6, further comprising a screen plate mounted in the distribution chamber so as to fix the pins axially in the perforated plate.

8. An apparatus according to claim 6, wherein an upper edge of each of the plurality of penetrating holes in the perforated plate defines an entry cone.

* * * * *